(12) United States Patent
Lee

(10) Patent No.: US 6,512,718 B2
(45) Date of Patent: Jan. 28, 2003

(54) CIRCUIT FOR CONTROLLING WORDLINE IN SRAM

(75) Inventor: Tae Ho Lee, Busankwangycok-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/013,353

(22) Filed: Dec. 13, 2001

(65) Prior Publication Data
US 2002/0071323 A1 Jun. 13, 2002

(30) Foreign Application Priority Data
Dec. 13, 2000 (KR) .......................................... 00-76014

(51) Int. Cl.$^7$ ................................................ G11C 8/00
(52) U.S. Cl. ................................. 365/230.06; 365/154
(58) Field of Search ............................ 365/154, 156, 365/230.06, 230.08, 194

(56) References Cited

U.S. PATENT DOCUMENTS 5,812,482 A * 9/1998 Jiang et al. ............. 365/230.06
5,875,148 A * 2/1999 Tanaka et al. ........... 365/230.06
6,055,203 A * 4/2000 Agarwal et al. .......... 365/230.06
6,240,039 B1 * 5/2001 Lee et al. ................ 365/230.06

* cited by examiner

Primary Examiner—Son Mai
(74) Attorney, Agent, or Firm—Morgan, Lewis & Bockius LLP

(57) ABSTRACT

A circuit for controlling a wordline in an SRAM includes an X address decoder for receiving and decoding a series of X addresses, and forwarding X addresses of a relevant cell, a cell block having a plurality of wordlines respectively connected to cells for storage of data, and a plurality of bitlines perpendicular to the wordlines, a wordline driver for receiving the X addresses, and forwarding a wordline enable signal for the cell block, a column selector for selecting one pair of bitlines from the plurality of bitlines, a sense amplifier for amplifying, and forwarding an output of the column selector in reading, a write driver for receiving, and providing a driving signal, and a wordline control part for selecting one of a write driver enable signal in writing and a sense amplifier enable signal in reading in response to a read/write identifying signal, to generate a control signal, and forward the control signal after delay of a preset time period, for disabling the wordline.

12 Claims, 6 Drawing Sheets

CIRCUIT FOR CONTROLLING WORDLINE IN SRAM

The present invention claims the benefit of Korean Patent Application No. P2000-76014 filed in Korea on Dec. 13, 2000, which is hereby incorporated by reference.

BACKGROUND OF THE INVENTION

1. Field of the Invention

The present invention relates to a semiconductor memory, and more particularly, to a circuit for controlling a wordline in an SRAM, in which an enabled wordline is disabled after a preset time period of delay for reducing a current consumed at a cell in reading/writing the cell.

2. Discussion of the Related Art

Referring to FIG. 1, a related art SRAM device is provided with an X address decoder 10 for receiving, and decoding a series of X addresses, and selecting, and forwarding X addresses XD0, and XDI of a cell, a wordline driver 11 for receiving the selected X addresses XD0, and XDI, and providing a wordline enable signal WL of the cell, a cell block 12 having a plurality of wordlines respectively connected to a plurality of cells for storage of data, and bitlines formed perpendicular to the wordlines, a column collector 13 for selecting one of the bitlines BL, and $\overline{BL}$ in the cell block, and a sense amplifier and a write driver 14 for amplifying, and forwarding a signal on a common dataline DL, and $\overline{DL}$ of the column selector 13 by means of a sense amplifier in reading, and dividing a received data Din, and providing the divided data to the common datalines DL, and $\overline{DL}$ respectively by means of a write driver. The sense amplifier is driven in response to a sense amplifier enable signal SEN, and the write driver is driven in response to a write driver enable signal WDEN.

The operation of the related art SRAM will be explained with reference to FIGS. 2A–2B.

In writing, the X address decoder receives, and decodes the X addresses, and forwards XD0 and XDI. For representing a write pad input waveform being a write, $\overline{WE}$ is transited to a low state. The wordline driver 11 is actuated in response to the XD0 and XDI signals, to provide a high level wordline enable signal WL. When the high level wordline enable signal WL is provided to the cell block 12, a preset selected wordline in the cell block 12, i.e., ROW cells are enable to an actuated state.

In the meantime, when $\overline{WE}$ is transited to a low state, making the write driver enable signal WDEN kept at a low state, the write driver in the sense amplifier and write driver 14 is enabled, to produce a low, or high level potential difference between the common datalines DL, and $\overline{DL}$ when a data DIN to be written on a preset cell in the cell block is received. Then, the column selector 13 selects one of the bitlines BL, and $\overline{BL}$ according to the potential difference, to select a cell of an enabled wordline to write the data thereon.

Referring to FIG. 2B, in reading, the word driver 11 receives the XD0, and XDI decoded and provided from the X addresses, and enables a wordline. The enabled wordline selects a cell in the cell block 12, to discharge one of the bitline BL, and the bitline $\overline{BL}$ having an inverted potential of the bitline BL, both of which are connected to the wordline, so that the column selector 13 provides the potential of the pair of the bitlines to the common dataline. As the potential difference is sensed, and amplified by the sense amplifier (in this instance, since it is a reading mode, $\overline{WE}$ is at a high level, and the SEN is at a high level, which is a enable state), a data output signal DOUT is read.

However, currents flow to the selected row cells of the related art SRAM in response to the wordline enable signal in writing or reading, and, if there is no change of a state of the wordline enable signal caused by the next writing or reading, the wordline maintains the enabled state, to make the current to flow to the cell, always.

That is, as can be known from FIGS. 2A–2B, because the related art SRAM has a great power consumption caused by continuous flow of cell current until selection of the next wordline coming from the wordline enable signal WL kept at a high state even after the wordline, i.e., a row cell, is enabled in response to the wordline enable signal WL, and reads, or writes a data, which power consumption is the greater as the operative voltage is the higher, the related art SRAM is not suitable to recent SRAM devices which require a low power consumption.

SUMMARY OF THE INVENTION

Accordingly, the present invention is directed to a circuit for controlling a wordline in an SRAM that substantially obviates one or more of the problems due to limitations and disadvantages of the related art.

An object of the present invention is to provide a circuit for controlling a wordline in an SRAM, in which a wordline enable signal at an enabled state even after data reading or writing is disabled, for preventing a power consumption of the cell.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a circuit for controlling a wordline in an SRAM includes an X address decoder for receiving and decoding a series of X addresses, and forwarding X addresses of a relevant cell, a cell block having a plurality of wordlines respectively connected to cells for storage of data, and a plurality of bitlines perpendicular to the wordlines, a wordline driver for receiving the X addresses, and forwarding a wordline enable signal for the cell block, a column selector for selecting one pair of bitlines from the plurality of bitlines, a sense amplifier for amplifying, and forwarding an output of the column selector in reading, a write driver for receiving, and providing a driving signal, and a wordline control part for selecting one of a write driver enable signal in writing and a sense amplifier enable signal in reading in response to a read/write identifying signal, to generate a control signal, and forward the control signal after delay of a preset time period, for disabling the wordline.

In another aspect, a method for controlling a wordline in an SRAM includes receiving and decoding a series of X addresses via an X address decoder, forwarding X addresses of a relevant cell, storing data via a cell block having a plurality of wordlines respectively connected to cells, receiving the X addresses via a wordline driver, forwarding a wordline enable signal for the cell block, selecting one pair of bitlines from the plurality of bitlines via a column selector, amplifying, and forwarding an output of the column selector in reading via a sense amplifier, receiving, and providing a driving signal via a write driver, and selecting one of a write driver enable signal in writing and a sense amplifier enable signal in reading in response to a read/write identifying signal, to generate a control signal, and forward the control signal after delay of a preset time period, for disabling the wordline via a wordline control part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
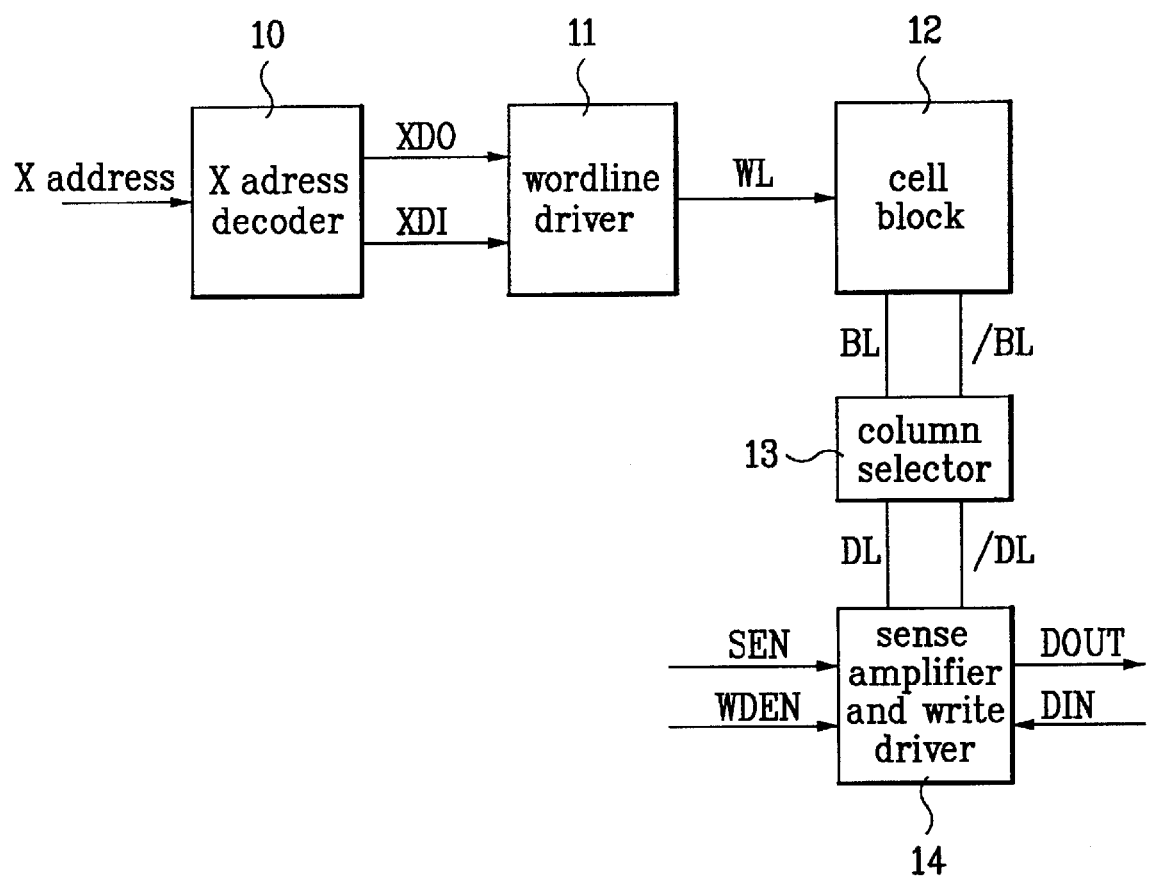
FIG. 1 illustrates a schematic block diagram of a related art circuit for controlling a wordline in an SRAM.
Figure 2A:
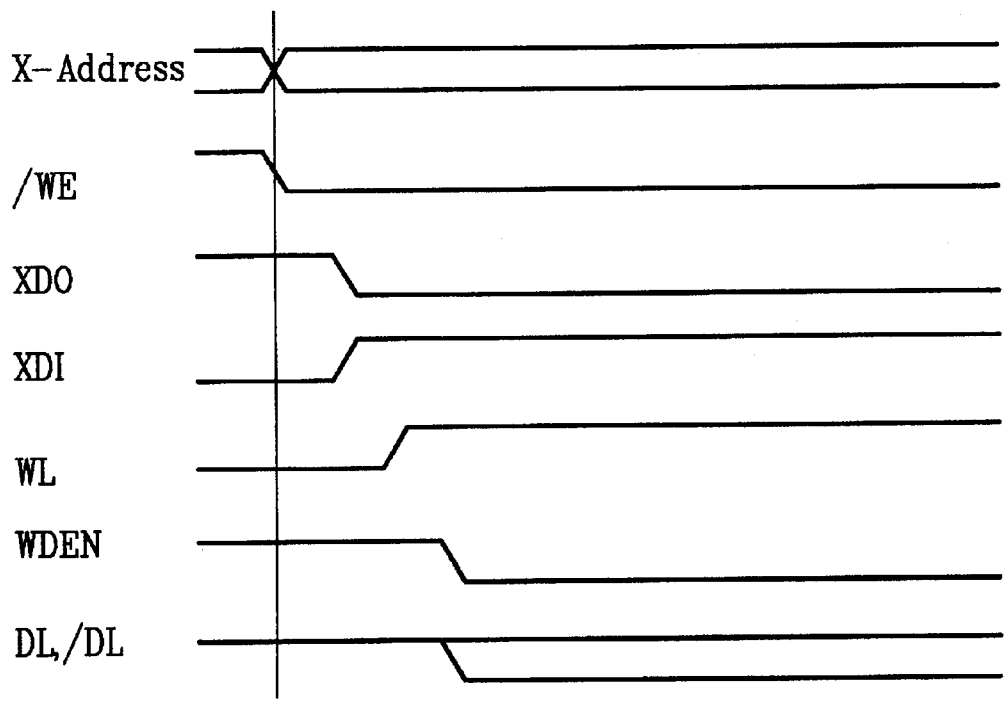
FIGS. 2A–2B illustrate timing diagrams of the circuit in FIG. 1.
Figure 2B:
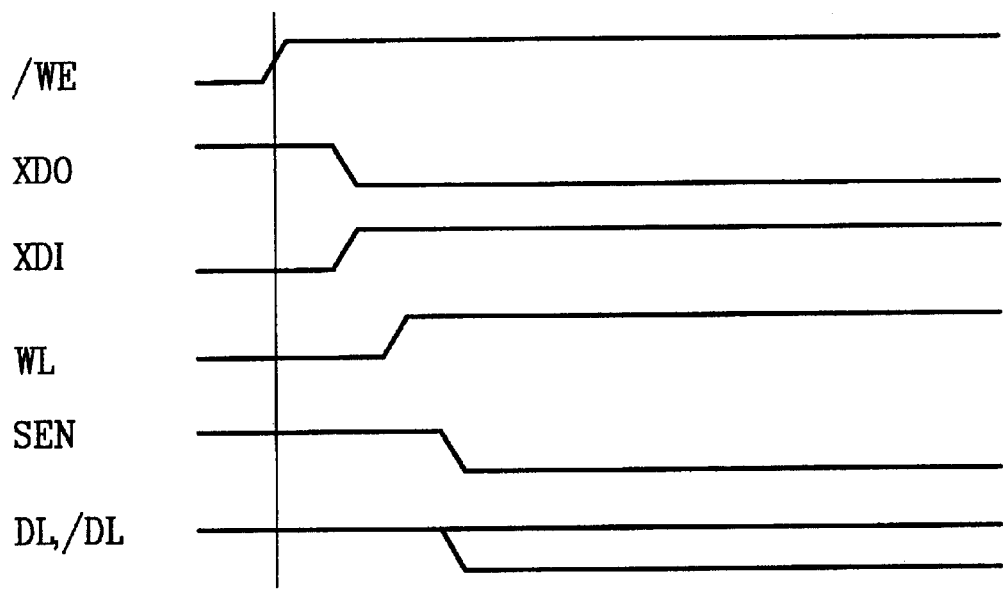
Figure 3:
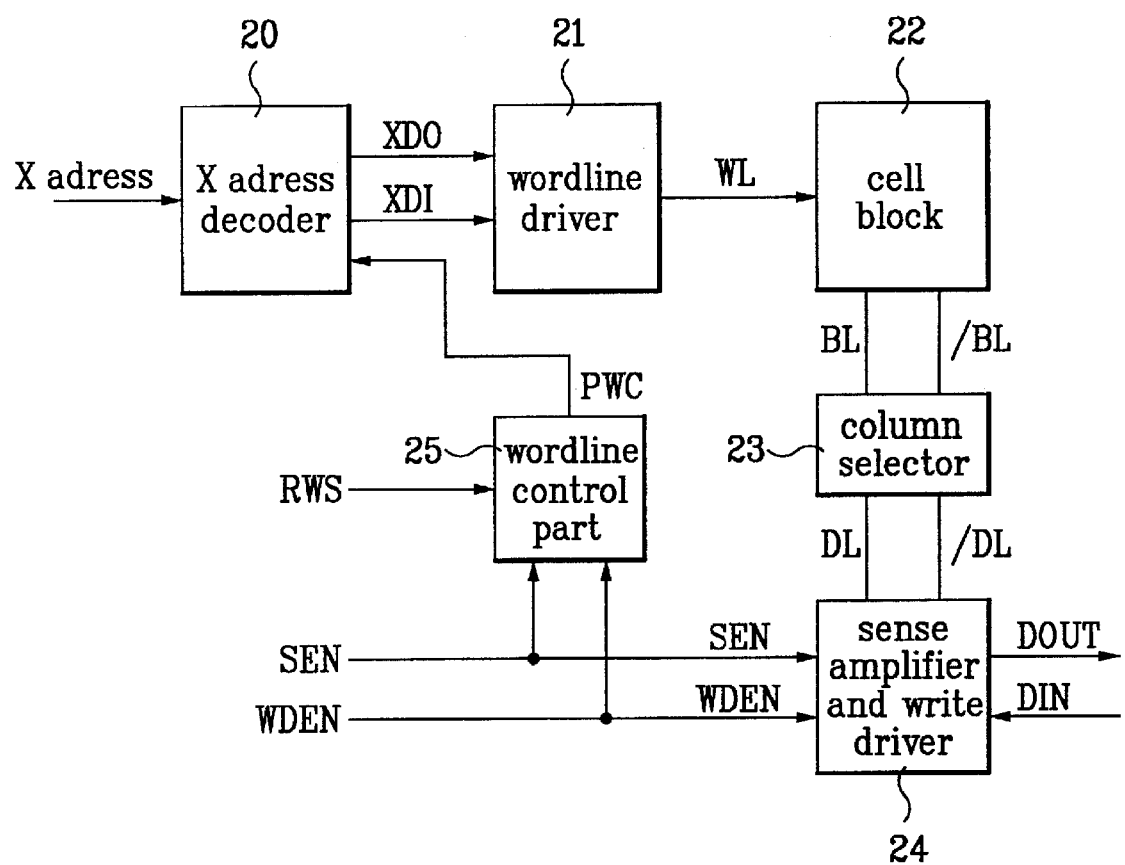
FIG. 3 illustrates a block diagram of an exemplary circuit for controlling a wordline in an SRAM in accordance with the present invention.

Referring to FIG. 3, a circuit for controlling a wordline in an SRAM in accordance with a preferred embodiment of the present invention includes an X address decoder 20 for receiving, and decoding a series of X addresses, and forwarding X addresses XD0, and XDI of a relevant cell, a wordline driver 21 for receiving the X addresses XD0, and XDI, and forwarding a wordline enable signal WL for the cell block, a cell block 22 having a plurality of wordlines respectively connected to cells for storage of data, and a plurality of bitlines perpendicular to the wordlines, a column selector 23 for selecting one pair of bitlines from a plurality of bitlines BL, and $\overline{BL}$, a sense amplifier and write driver 24 having a sense amplifier to be enabled by a sense amplifier enable signal SEN in reading for amplifying, and forwarding a signal on a common dataline DL, and $\overline{DL}$ as an output data DOUT, and a write driver to be enabled in response to a write driver enable signal WDEN in writing for receiving, and providing a data DIN to the common data line DL, and $\overline{DL}$, and a wordline control part 25 for selecting either the write driver enable signal WDEN, or the sense amplifier enable signal SEN in response to a read/write identifying signal RWS, and delaying for a preset time period, and forwarding as a control signal PWC.

The sense amplifier in the sense amplifier and write driver 24 is enabled in response to the sense amplifier enable signal SEN in reading for amplifying, and forwarding a signal on the bitline selected at the column selector 23 and turned up on the common dataline DL and $\overline{DL}$.

The write driver in the sense amplifier and write driver 24 is enabled in response to the write driver enable signal WDEN in writing for forwarding a received data DIN to the common dataline DL and $\overline{DL}$.

The wordline control part 25 selects either the write driver enable signal WDEN or the sense amplifier enable signal SEN to provide a control signal in response to the received read/write identifying signal RWS, delays the control signal for a preset time period, and forwards a pulse wordline control signal PWC. The pulse wordline control signal PWC, being a control signal, controls an output of the X address decoder 20 for disabling the wordline enable signal.

Figure 5:
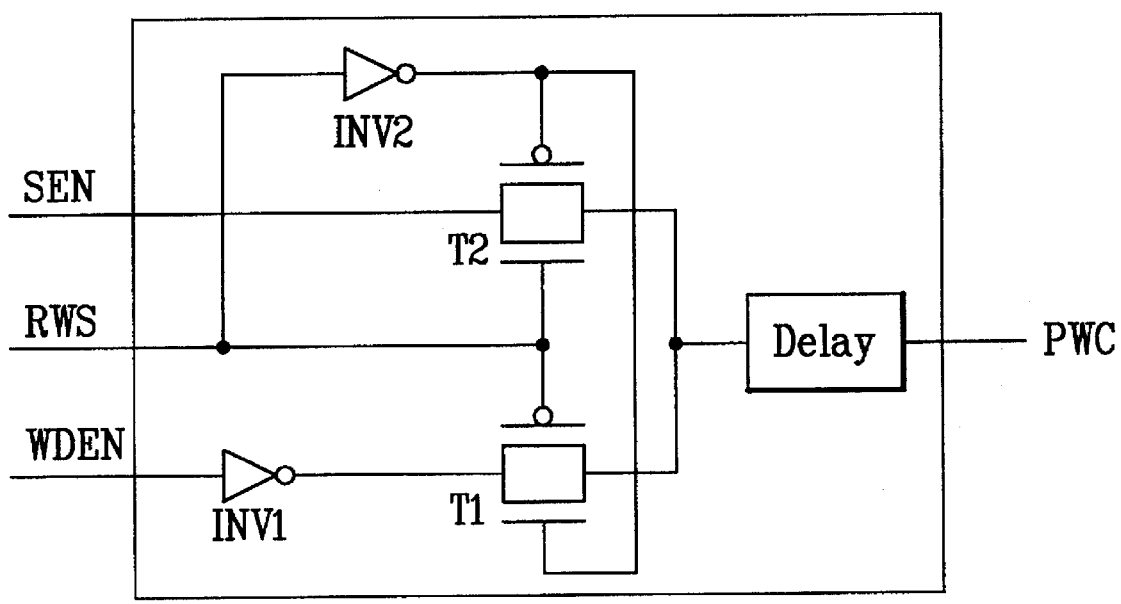
FIG. 5 illustrates a detailed circuit of the wordline control part in FIG. 3.

Referring to FIG. 5, the wordline control part 25 includes a first inverter INV1 for inverting a write driver enable signal WDEN, a second inverter INV2 for inverting the read/write identifying signal RWS, a first transmission gate T1 having a PMOS gate for receiving the read/write identifying signal, and an NMOS gate for receiving an output of the second inverter INV2, for switching an output of the first inverter INV1, a second transmission gate T2 having an NMOS gate for receiving the read/write identifying signal RWS, and a PMOS gate for receiving an output of the second inverter INV2, for switching a sense amplifier enable signal SEN, and a delay for receiving outputs of the first, and second transmission gates T1, and T2 to providing a pulse wordline control signal PWC, a control signal, after a preset time delay.

In the meantime, though the sense amplifier and write driver 24 is integrated in this embodiment, a sense amplifier may be separated from a write driver. Though the wordline driver 21 is separated from the wordline control part 25, the wordline driver 21 and the wordline control part 25 may be integrated.

Figure 4A:
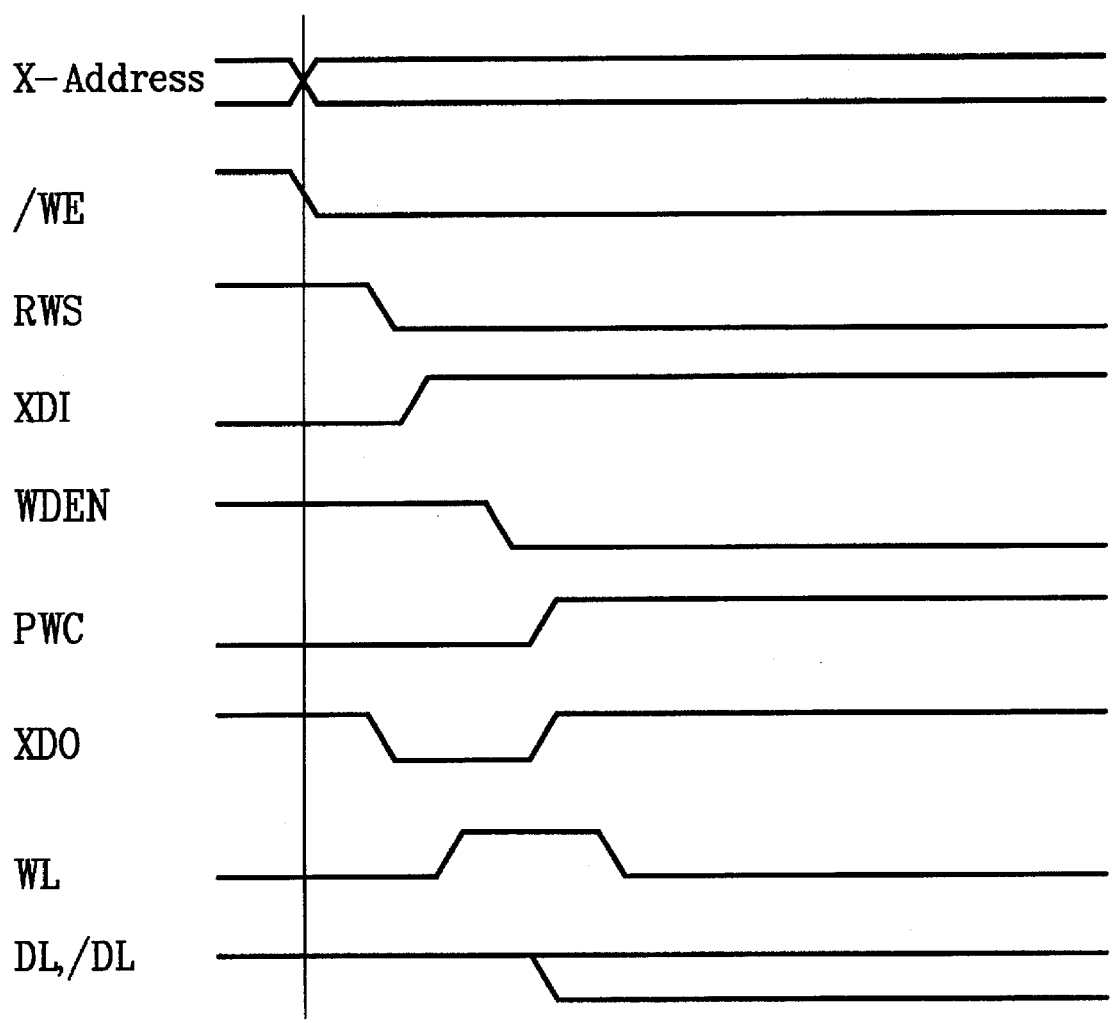
FIGS. 4A–4B illustrate timing diagrams of the circuit in FIG. 3.
Figure 4B:
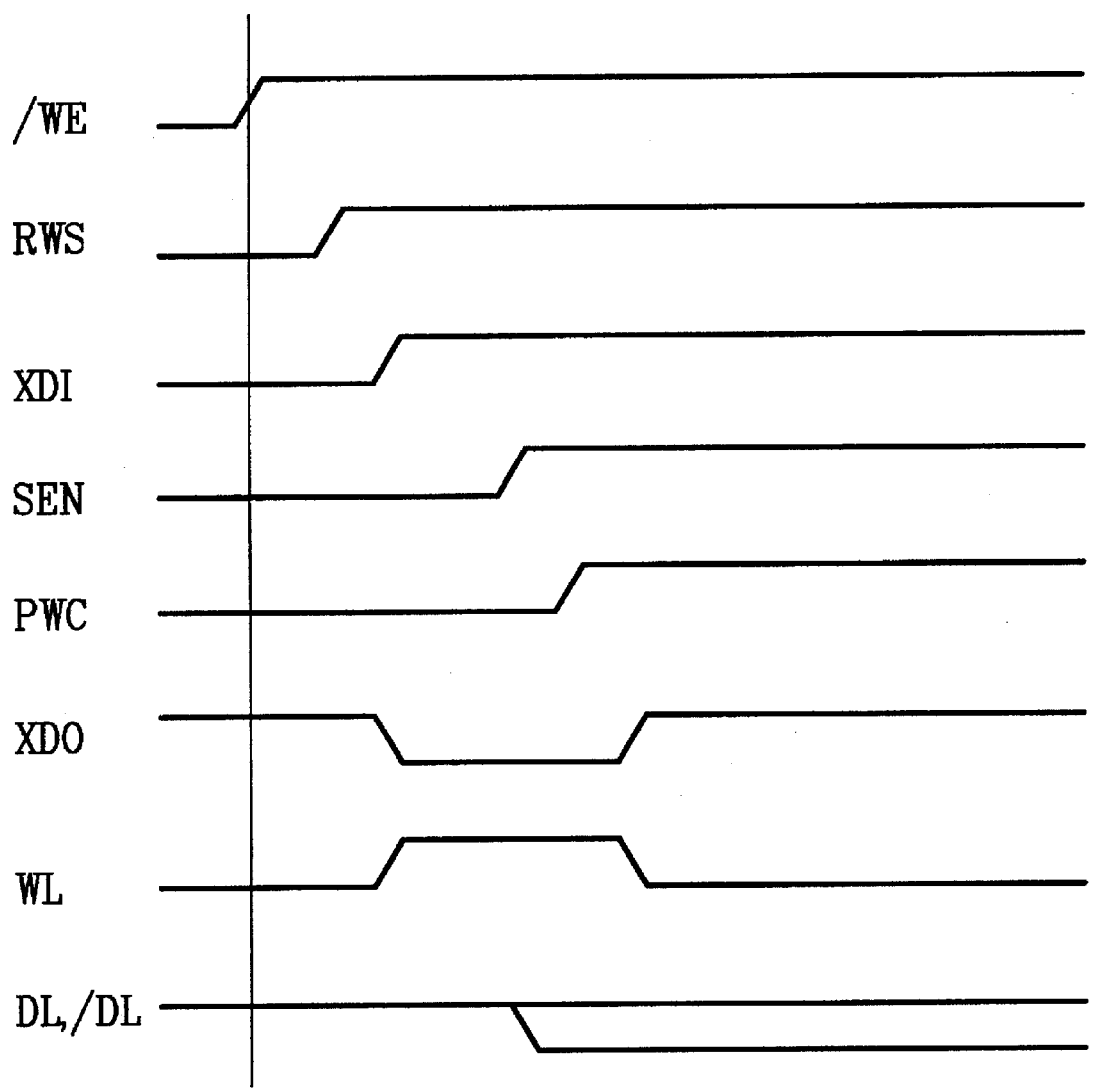

The operation of the circuit for controlling a wordline in an SRAM will be explained, with reference to FIGS. 3, 4A, and 4B. At first, writing operation will be explained.

A data DIN intended to store in a cell in the cell block 22 is provided to the sense amplifier and write driver 24. In this instance, referring to FIG. 4A, for indicating the present operation being a writing, $\overline{WE}$ transits to a low level, and for indicating the present operation being a writing, the signal RWS which identifies read/write operation of the wordline control part 25 at receiving the $\overline{WE}$ transits to a low level (the RWS, being a read/write identifying signal, is in a high state in reading, and in a low state in writing).

In the meantime, the X address decoder 20 receives, and decodes a series of X addresses, and provides a driving signal XD0, and XDI for the wordline driver 21 for providing a wordline enable signal WL, to select a desired wordline of the cell block 23, to select a row cell.

In this instance, the data DIN is provided to the sense amplifier and write driver 24, and to the column selector 23 by the write driver 24, which is actuated in response to a low state write driver enable signal WDEN, through the common datalines DL, and $\overline{DL}$, with the data DIN divided by the common datalines DL, and $\overline{DL}$, and then, the column selector 23 selects a bitline BL, and $\overline{BL}$ of a pertinent column, to connect to a pertinent wordline enabled and discharged, to store the data in the cell.

Referring to FIG. 5, when the low state read/write identifying signal RWS is provided to the wordline control part 25, the first transmission gate T1 becomes conductive, to provide the low level write driver enable signal WDEN, inverted to a high level at the first inverter INV1, to the delay.

After a delay of a preset time period through the delay, i.e., after passing a time period for receiving, and finishing storage of data DIN in the cell, since a high level pulse wordline control signal PWC is provided to the X address decoder 20 to transit the output XD0 from a low state to a high state, and to transit an output WL of the wordline driver 21 to a low level, the wordline enabled to an activated state is disabled. Because this disable state of the wordline is remained unchanged until the next reading, or writing is made, there is no power consumption caused by leakage through an activated cell after the wordline is disabled.

On the other hand, in reading operation, $\overline{WE}$ transits to a high level, to transit the read/write identifying signal RWS to a high level. When the reading starts, the X address decoder 20 receives, and decodes a series of X addresses, and provides a high level XDI, and a low level XD0, and the wordline driver 21 receives the high level XDI, and low level XD0, and provides a signal WL for enabling a wordline, to activate a desired row cell in the cell block 22. In this instance, after a bitline BL and $\overline{BL}$ is selected by the column selector 23, to read a data in a relevant cell, the data is provided to the sense amplifier and write driver 24 through the common dataline DL and $\overline{DL}$. Then, the data is amplified at the sense amplifier and write driver 24, to present an output data DOUT.

In the meantime, in reading, the high level sense amplifier enable signal SEN is provided both to the sense amplifier and write driver 24 and the wordline control part 25, and, before this, a high level read/write identifying signal RWS is provided to the wordline control part 25.

A signal on the common data line DL and $\overline{DL}$ makes the sense amplifier and write driver 24 to provide a data DOUT, and when the high level sense amplifier enable signal SEN and the high level read/write identifying signal RWS are provided to the wordline control part 25, the second transmission gate T2 is made conductive, such that the high level sense amplifier enable signal SEN provides a high level pulse wordline control signal PWC through the second transmission gate T2 after a preset time period (i.e., a time period for finishing the reading) is passed through the delay.

The high level pulse wordline control signal PWC is provided to the X address decoder 20, to transit the low level XD0 to a high level. As the wordline driver 21 transits the wordline driver enable signal WL from a high level to a low level, to disable the wordline, operation of the cell in the cell block 22 is stopped, to stop flow of anymore current thereto.

The wordline control part provides the pulse wordline control signal PWC provided by receiving signals WDEN, SEN, and RWS to the X address decoder 20, to transit a state of XD0 from the X address decoder 20 from a low level to a high level. This transition of XD0 controls the wordline driver 21 to disable a relevant wordline, to cut off a current provided to the cell.

Thus, the circuit for controlling a wordline in an SRAM of the present invention prevents flow a current to a cell by disabling a wordline enable signal in operation after reading/writing a cell data.

As has been explained, the circuit for controlling a wordline in an SRAM of the present invention can minimize a power consumption at a cell by cutting off flow of the current by disabling the enabled wordline after reading/writing the cell.

It will be apparent to those skilled in the art that various modifications and variations can be made in the circuit for controlling a wordline in an SRAM of the present invention without departing from the spirit or scope of the invention. Thus, it is intended that the present invention cover the modifications and variations of this invention provided they come within the scope of the appended claims and their equivalents.

What is claimed is:

1. A circuit for controlling a wordline in an SRAM, comprising:

an X address decoder for receiving and decoding a series of X addresses, and forwarding X addresses of a relevant cell;

a cell block having a plurality of wordlines respectively connected to cells for storage of data, and a plurality of bitlines perpendicular to the wordlines;

a wordline driver for receiving the X addresses, and forwarding a wordline enable signal for the cell block;

a column selector for selecting one pair of bitlines from the plurality of bitlines;

a sense amplifier for amplifying, and forwarding an output of the column selector in reading;

a write driver for receiving, and providing a driving signal; and, a wordline control part for selecting one of a write driver enable signal in writing and a sense amplifier enable signal in reading in response to a read/write identifying signal, to generate a control signal, and forward the control signal after delay of a preset time period, for disabling the wordline.

2. The circuit according to claim 1, wherein the preset time period is set to be a time period for one of finishing reading and writing operation.

3. The circuit according to claim 1, wherein the wordline control part includes:

a first inverter INV1 for inverting the write driver enable signal WDEN;

a second inverter INV2 for inverting the read/write identifying signal RWS;

a first transmission gate T1 having a PMOS gate for receiving the read/write identifying signal, and an NMOS gate for receiving an output of the second inverter INV2, for switching an output of the first inverter;

a second transmission gate T2 having an NMOS gate for receiving the read/write identifying signal RWS, and a PMOS gate for receiving an output of the second inverter, for switching a sense amplifier enable signal SEN; and a delay for receiving outputs of the first, and second transmission gates T1, and T2 for providing a pulse wordline control signal PWC, a control signal, after a preset time delay.

4. The circuit according to claim 3, wherein the wordline control part receives signals of WDEN, SEN, and RWS, to generate and provide the pulse wordline control signal PWC to the X address decoder, for disabling an output of the X address decoder.

5. The circuit according to claim 3, wherein the wordline control part has one of the first and second transmission gates for selective operation for providing the pulse wordline control signal.

6. The circuit according to claim 5, wherein the selective operation of the one of the first and second transmission gates is controlled by the read/write identifying signal.

7. A method for controlling a wordline in an SRAM, comprising:

receiving and decoding a series of X addresses via an X address decoder;

forwarding X addresses of a relevant cell;

storing data via a cell block having a plurality of wordlines respectively connected to cells;

receiving the X addresses via a wordline driver;

forwarding a wordline enable signal for the cell block;

selecting one pair of bitlines from the plurality of bitlines via a column selector;

amplifying, and forwarding an output of the column selector in reading via a sense amplifier;

receiving, and providing a driving signal via a write driver; and, selecting one of a write driver enable signal in writing and a sense amplifier enable signal in reading in response to a read/write identifying signal, to generate a control signal, and forward the control signal after delay of a preset time period, for disabling the wordline via a wordline control part.

8. The method according to claim 7, wherein the preset time period is set to be a time period for one of finishing reading and writing operation.

9. The method according to claim 7, wherein the wordline control part includes:

a first inverter INV1 for inverting the write driver enable signal WDEN;

a second inverter INV2 for inverting the read/write identifying signal RWS;

a first transmission gate T1 having a PMOS gate for receiving the read/write identifying signal, and an NMOS gate for receiving an output of the second inverter INV2, for switching an output of the first inverter;

a second transmission gate T2 having an NMOS gate for receiving the read/write identifying signal RWS, and a PMOS gate for receiving an output of the second inverter, for switching a sense amplifier enable signal SEN; and a delay for receiving outputs of the first, and second transmission gates T1, and T2 for providing a pulse wordline control signal PWC, a control signal, after a preset time delay.

10. The method according to claim 9, wherein the wordline control part receives signals of WDEN, SEN, and RWS, to generate and provide the pulse wordline control signal PWC to the X address decoder, for disabling an output of the X address decoder.

11. The method according to claim 9, wherein the wordline control part has one of the first and second transmission gates for selective operation for providing the pulse wordline control signal.

12. The method according to claim 11, wherein the selective operation of the one of the first and second transmission gates is controlled by the read/write identifying signal.

* * * * *